United States Patent [19] [11] Patent Number: 4,792,922
Mimoto et al. [45] Date of Patent: Dec. 20, 1988

[54] DYNAMIC SEMICONDUCTOR MEMORY WITH SMALLER MEMORY CELLS

[75] Inventors: Toshio Mimoto, Nara; Yoshiji Ota, Terni, both of Japan

[73] Assignee: Sharp Kabushiki Kaisha, Osaka, Japan

[21] Appl. No.: 77,991

[22] Filed: Jul. 24, 1987

Related U.S. Application Data

[62] Division of Ser. No. 727,360, Apr. 25, 1985, abandoned.

[30] Foreign Application Priority Data

May 12, 1984 [JP] Japan .................................. 59-95425

[51] Int. Cl.⁴ ............................................ G11C 11/24
[52] U.S. Cl. ..................... 365/149; 365/203; 365/205
[58] Field of Search ................ 365/149, 203, 205, 210

[56] References Cited

U.S. PATENT DOCUMENTS

4,417,329 11/1983 Mezawa et al. ...................... 365/203
4,493,056 1/1985 Mao ..................................... 365/149
4,520,466 5/1985 Mashiko ............................... 365/210

OTHER PUBLICATIONS

IBM Technical Disclosure Bulletin-vol. 23, No. 6, Nov. 1980, pp. 2331-2332.

Primary Examiner—James W. Moffitt
Attorney, Agent, or Firm—Flehr, Hohbach, Test, Albritton & Herbert

[57] ABSTRACT

A dynamic semiconductor memory comprises complementary bit lines for input and output of information, storage capacitors for storing information, and devices for specifying selected storage capacitors, each of the storage capacitors having one end connected to one end of the complementary bit lines and the other end to the other end of the complementary bit lines through one of the specifying devices to form a memory cell structure.

3 Claims, 11 Drawing Sheets

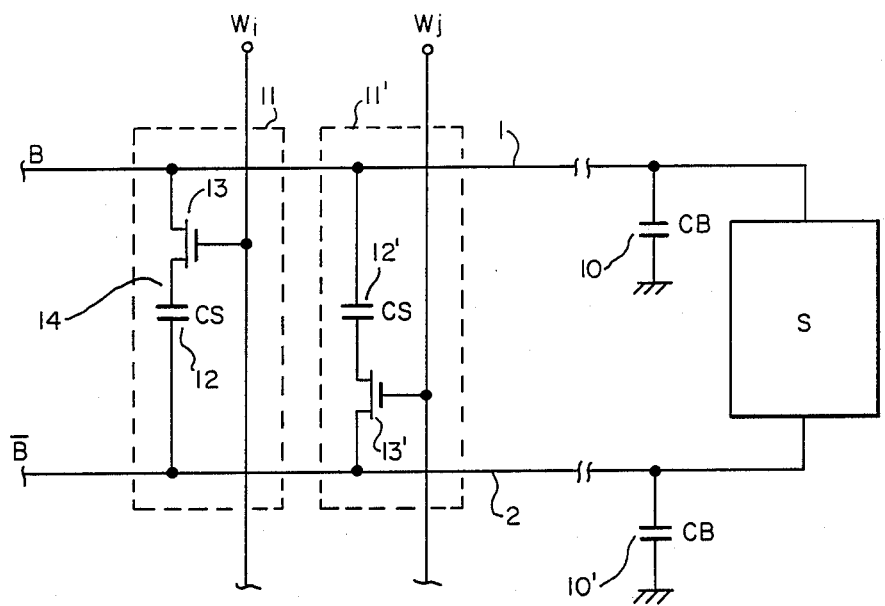
FIG.—1
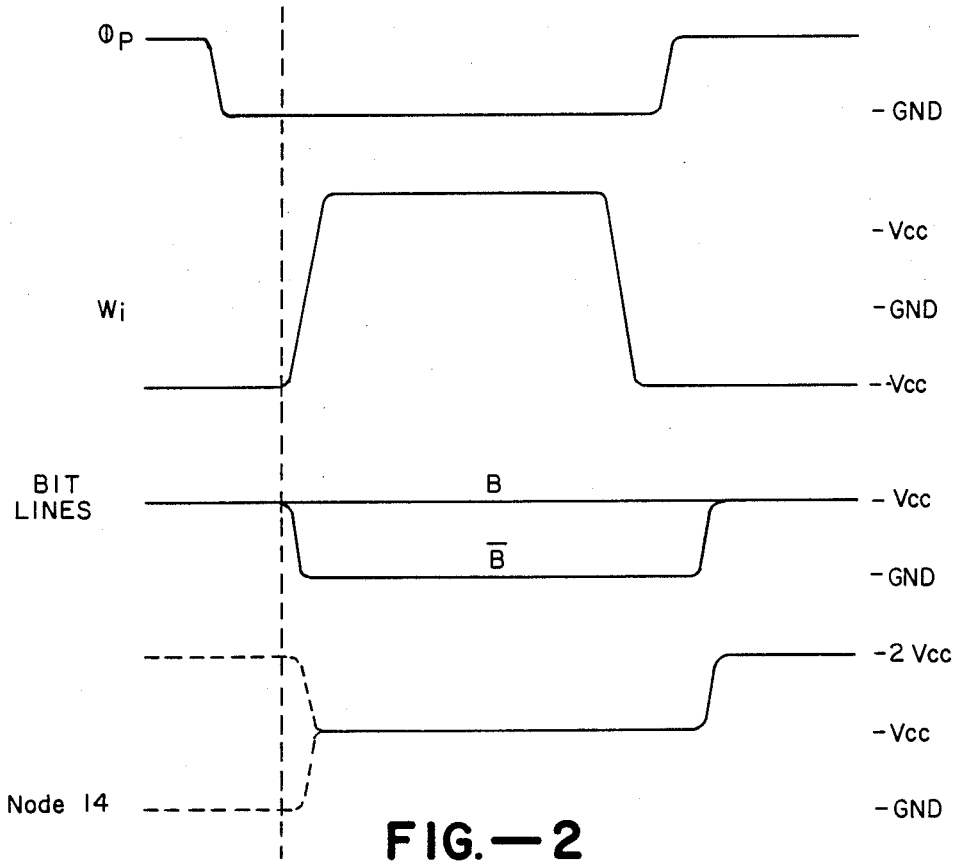
FIG.—2

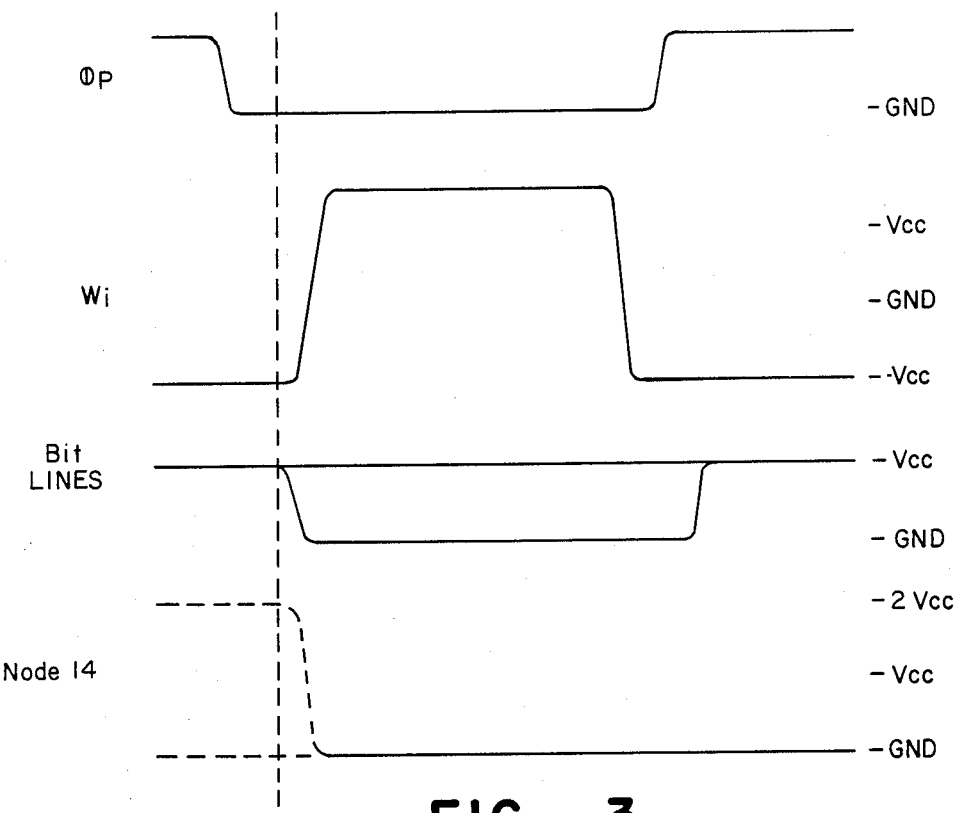
FIG.—3
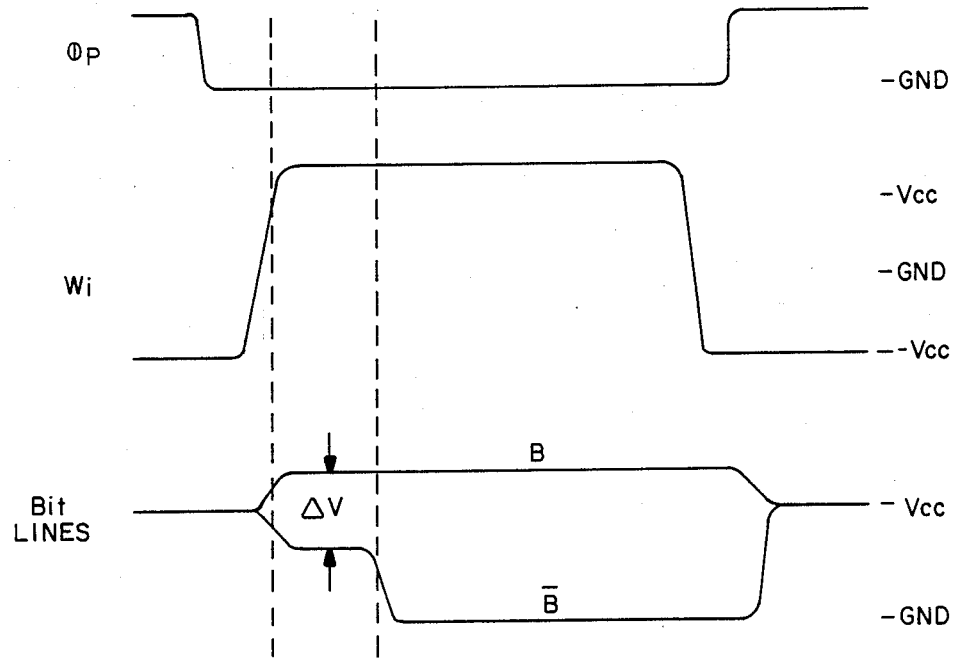
FIG.—4

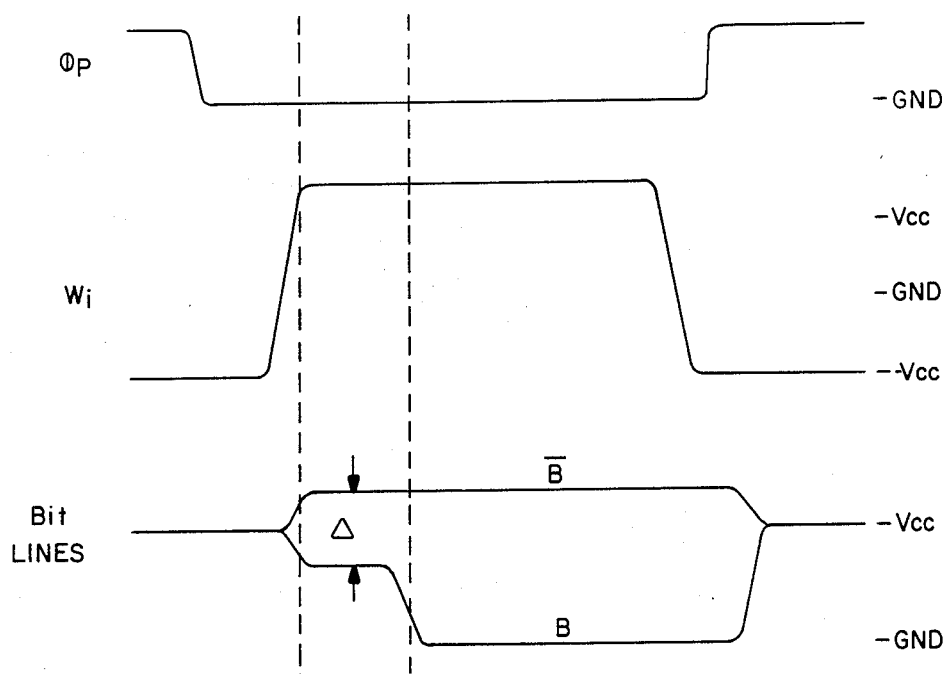
FIG. —5
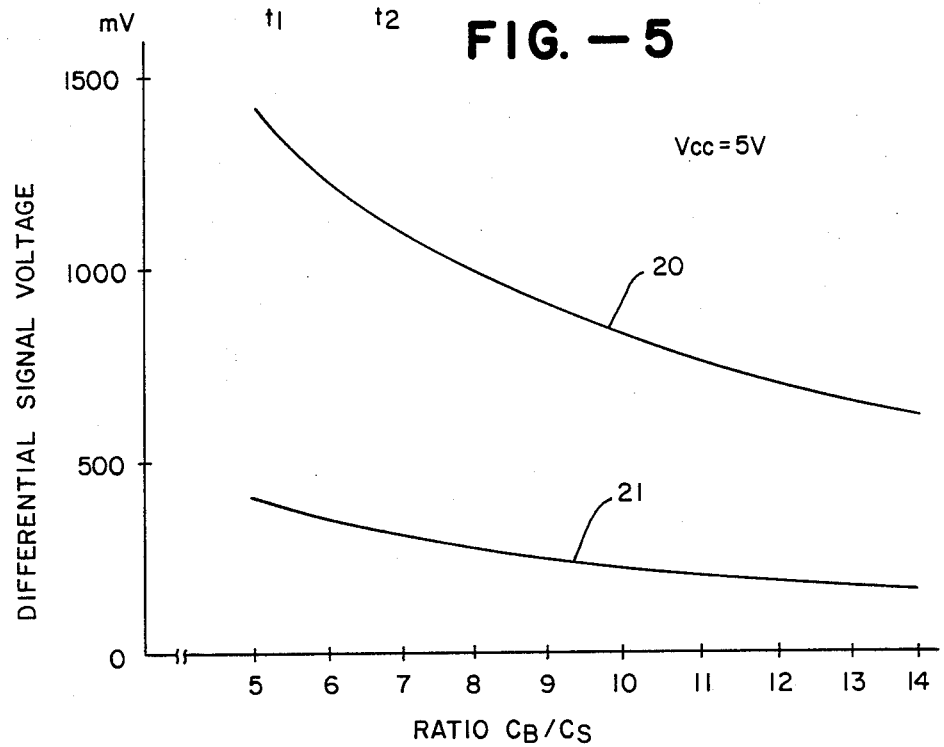
FIG. —6

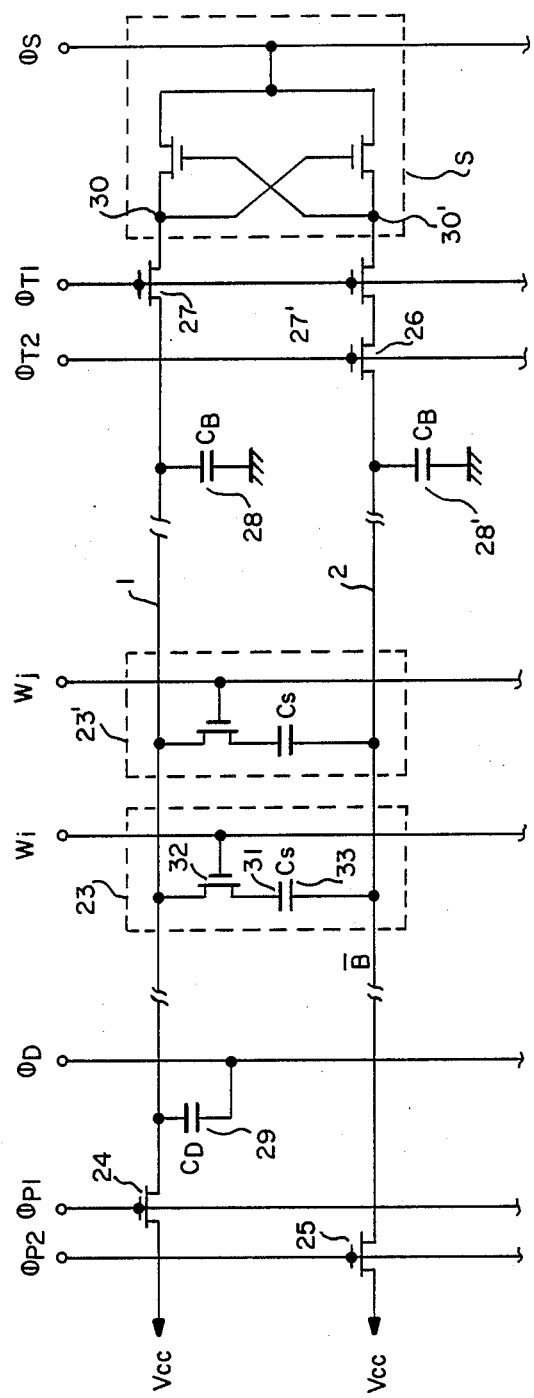
FIG.—7

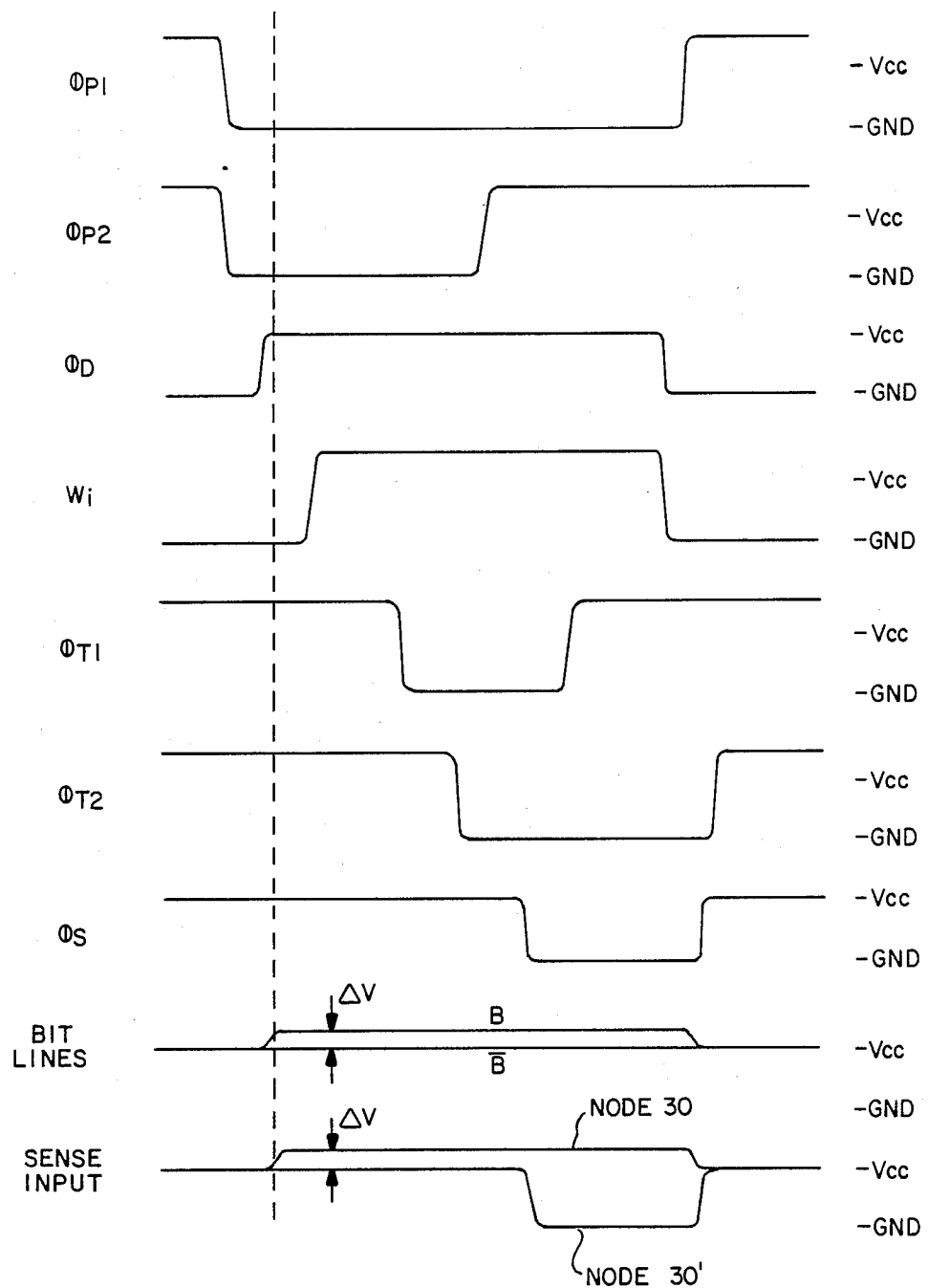
FIG. —8

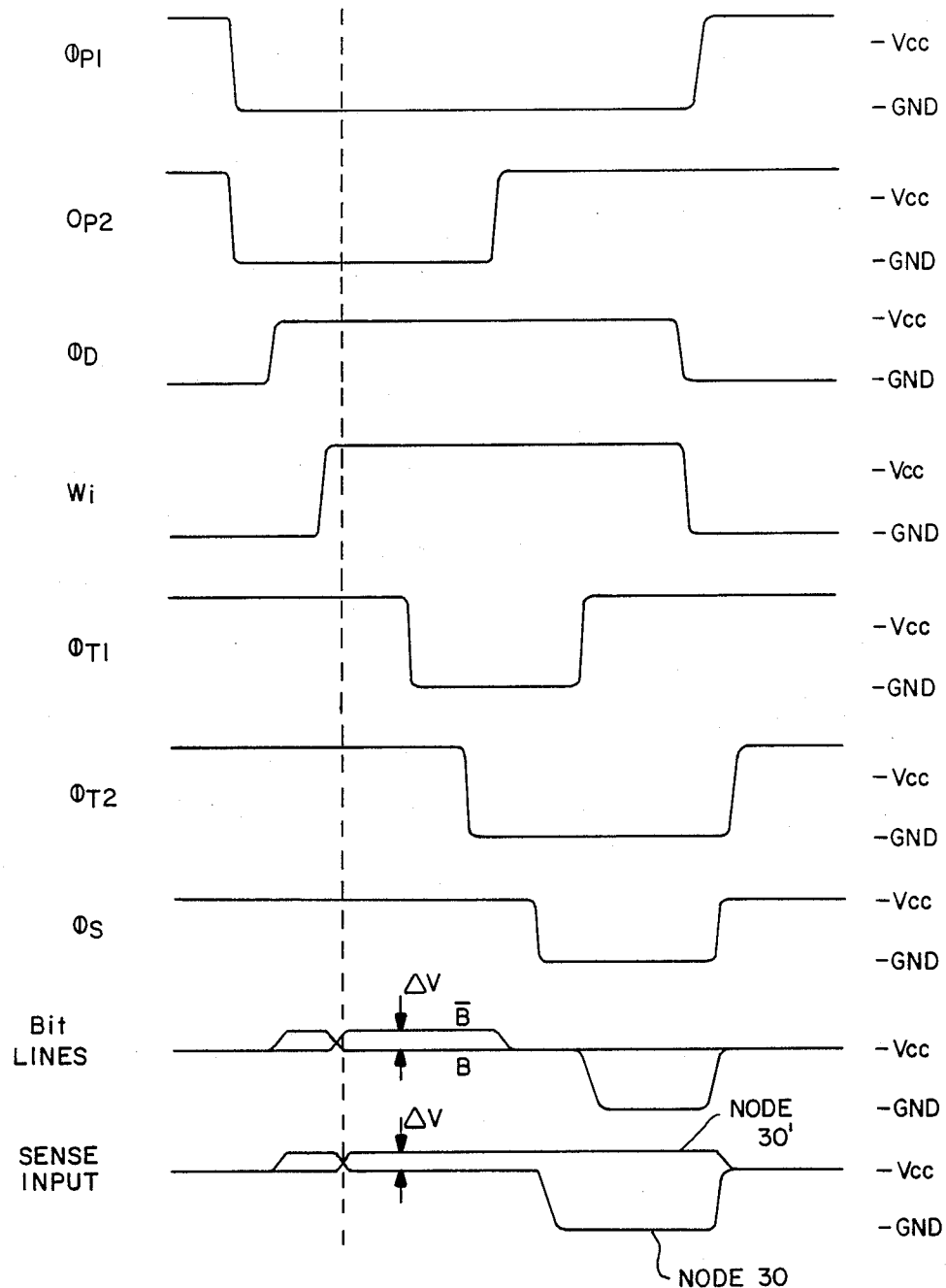
FIG.—9

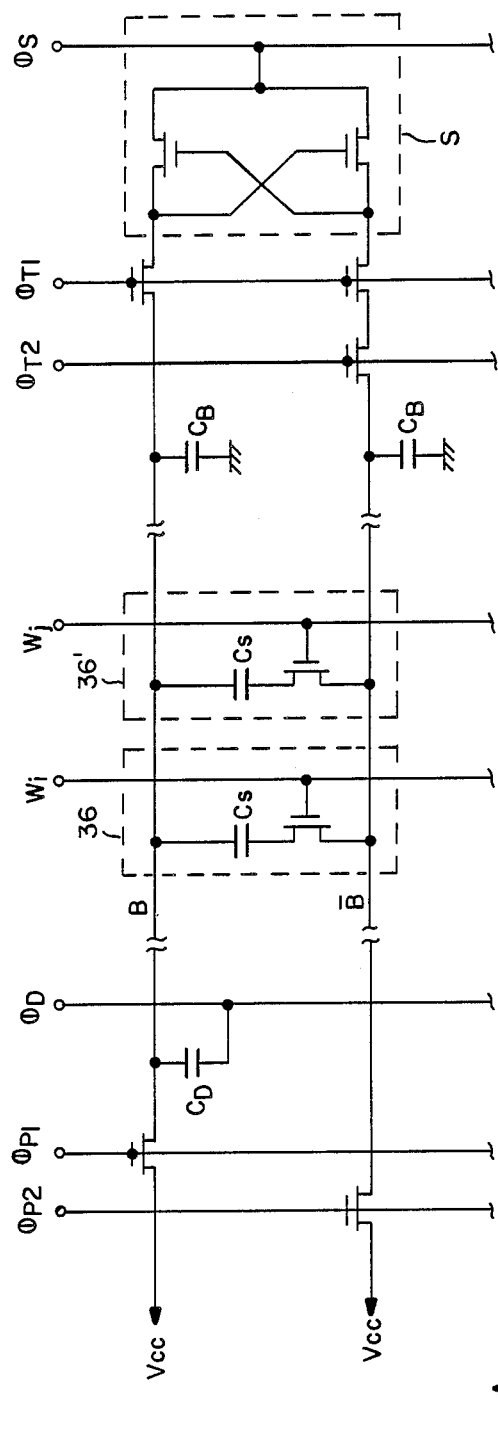
FIG.—11
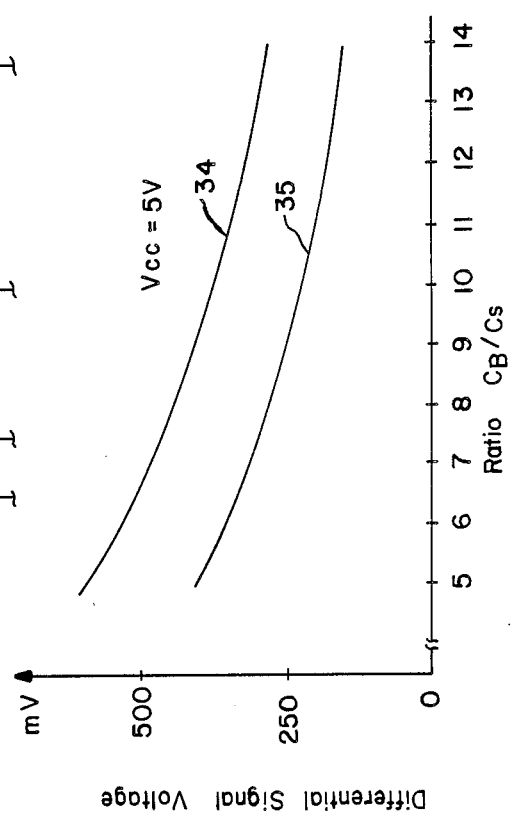
FIG.—10

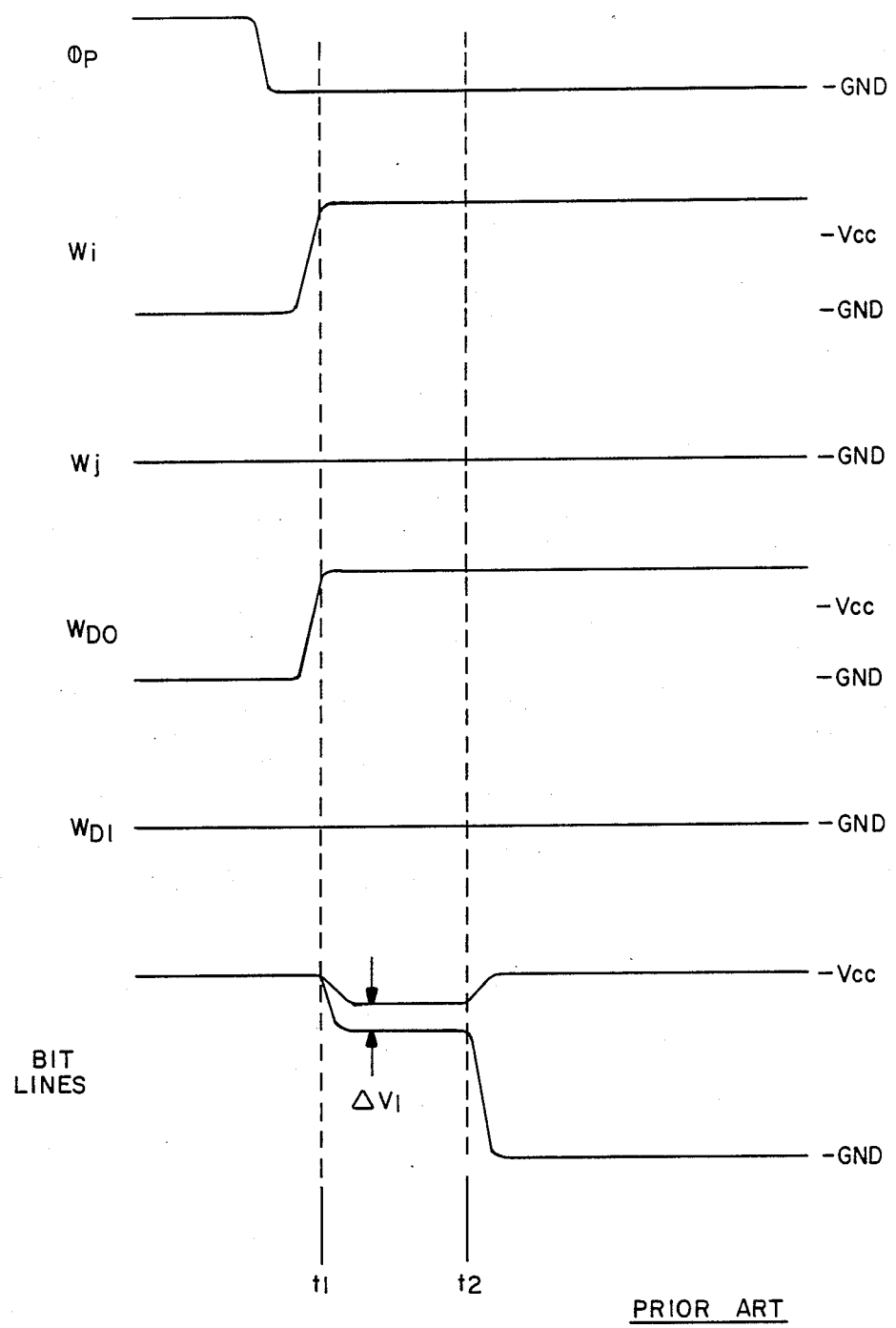
FIG.—14

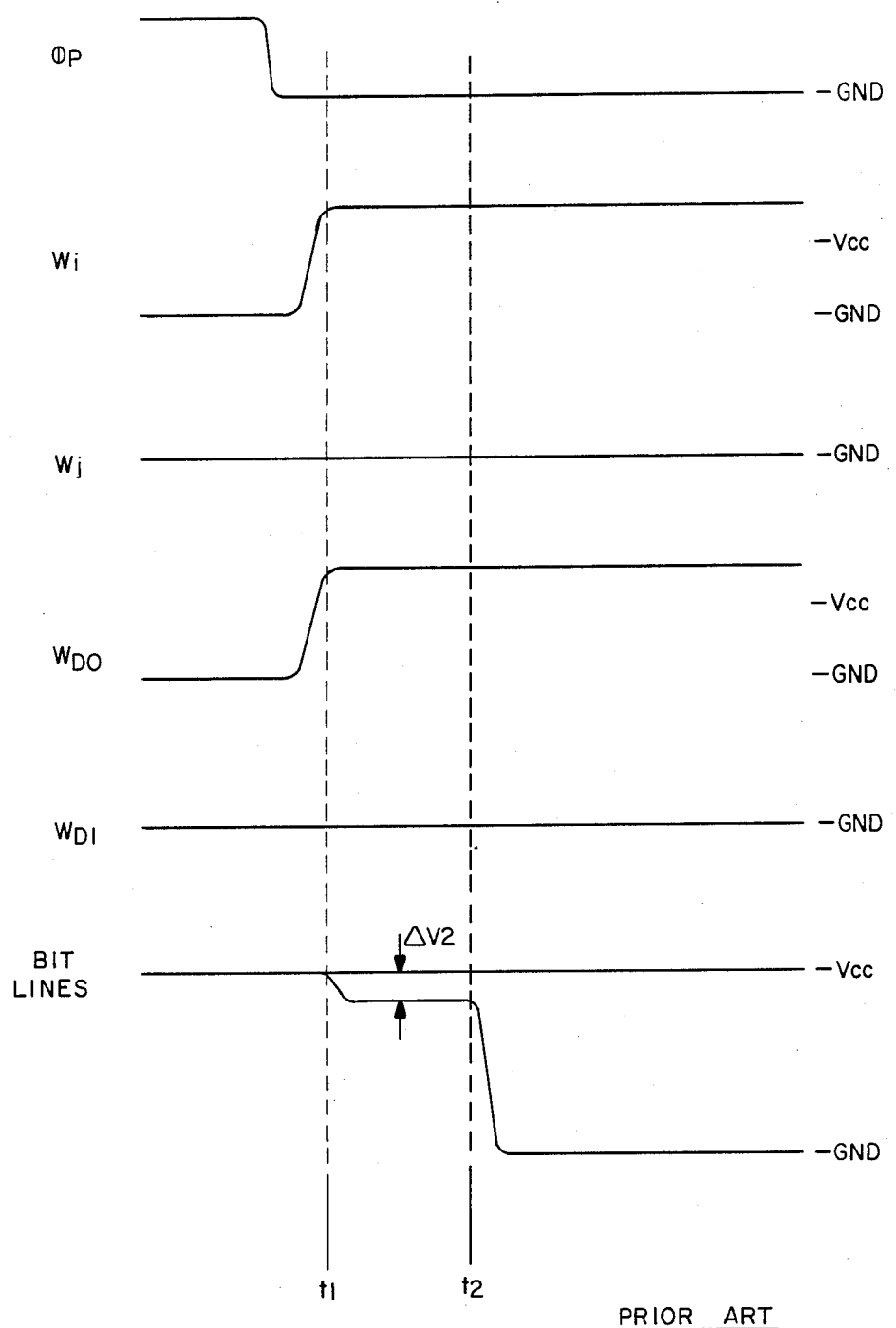
FIG.—15

DYNAMIC SEMICONDUCTOR MEMORY WITH SMALLER MEMORY CELLS

This is a division of application Ser. No. 727,360 filed Apr. 25, 1985, now abandoned.

This invention relates to an improved dynamic semiconductor memory and more particularly to a dynamic semiconductor memory with a new memory cell structure.

In order to explain the problems that arise in the case of a dynamic memory element with a conventional memory cell structure, there is shown in FIG. 13 a typical circuit for a prior art N-channel MOS dynamic memory element wherein a sense amplifier S is connected by complementary bit lines 51 and 52 to memory cells 53 and 53' and dummy cells 54 and 54'. $W_i$ and $W_j$ are word lines, $W_{D0}$ and $W_{D1}$ are dummy word lines, and $\phi_P$ is a precharge signal. Numerals 55 and 55' are storage capacitors with capacitance $C_S$ and transfer gates 56 and 56' are for selecting a desired storage capacitor and are electrically connected to the bit lines 51 and 52. Numerals 57 and 57' are dummy storage capacitors with capacitance $C_D$, and transfer gates 58 and 58' are adapted to selectively connect the dummy storage capacitors 57 and 57' to the bit lines 51 and 52. Numerals 59 and 59' are gates for initializing the dummy storage capacitors 57 and 57'. Numerals 60 and 60' are parasitic bit line capacitors with capacitance $C_B$.

FIGS. 14 and 15 are timing diagrams for explaining the operation of the circuit of FIG. 13. FIG. 14 shows a situation where a low potential (logic "0") is read out from the memory cell. FIG. 15 shows a situation where a high potential (logic "1") is read out from the memory cell.

If the memory cell 53 on the bit line 51 of FIG. 13 is selected, the dummy cell 54' on the bit line 52 is selected while the dummy cell 54 on the bit line 51 is selected if the memory cell on the bit line 52 is selected. In what follows, the situation where the word line $W_i$ and the dummy word line $W_{D0}$ are at a high potential and the memory cell 53 and the dummy cell 54' are selected will be considered. We shall also assume that voltages higher than the source voltage $V_{CC}$ are applied to the word line $W_i$ and the dummy word line $W_{D0}$ and that the bit lines 51 and 52 are precharged to the source voltage $V_{CC}$ during a precharge period when the precharge signal $\phi_P$ is at a high potential.

(i) When the ground potential GND is stored in the storage capacitor 55 of the memory cell 53:

When the precharge signal $\phi_P$ drops to a low potential level at the beginning of an active period and a word line signal is inputted at time $t_1$, the potential $V_{B1}$ on the bit line 51 becomes $V_{B1}=C_B V_{CC}/(C_B+C_S)$ while the potential $V_{B2}$ on the bit line 52 on the dummy cell side becomes $V_{B2}=C_B V_{CC}/(C_B+C_D)$. Accordingly, the differential voltage $\Delta V_1$ inputted to the sense amplifier S becomes $\Delta V_1 = V_{B2} - V_{B1} = [C_B/(C_B+C_D) - C_B/(C_B+C_S)]V_{CC}$.

(ii) When the source voltage $V_{CC}$ is stored in the storage capacitor 55 of the memory cell 53:

In this situation, the potential $V_{B1}$ on the bit line 51 does not change so that $V_{B1}=V_{CC}$. On the other hand, the potential $V_{B2}$ on the bit line 52 becomes $V_{B2}=C_B V_{CC}/(C_B+C_D)$ as in the case of (i). Accordingly, the differential voltage $\Delta V_2$ inputted to the sense amplifier S become $\Delta V_2 = V_{B2} - V_{B1} = [1 - C_B/(C_B+C_D)]V_{CC}$.

If the capacitance $C_D$ of the dummy cells are so selected that the differential voltage inputted to the sense amplifier S will be the same both in the case of (i) and in the case of (ii), the differential voltage inputted to the sense amplifier S will be $$\Delta V_1 = \Delta V_2 = (\tfrac{1}{2})C_S V_{CC}/(C_B+C_S) \qquad \text{Eq. 1}$$

This differential voltage is amplified to a desired level after time $t_2$ when the sense amplifier S becomes activated.

In such a circuit of a conventional design, therefore, the balancing of load capacitors between the bit lines 51 and 52 is extremely important. It is difficult, however, to maintain the required balance because of the fluctuations resulting from the fabrication processes, etc. With the recent progress in miniaturized fabrication technologies, large-scale memory elements are being developed and the memory cell areas must necessarily become smaller. As a result, the storage capacitors in memory cells become even smaller and there arises a problem if the differential voltage necessary for driving the sense amplifier cannot be obtained.

It is therefore an object of the present invention to provide a dynamic semiconductor memory which can provide a much larger differential voltage to be inputted to a sense amplifier even if storage capacitors of a conventional type are used, or allows its memory cells to be made much smaller for obtaining differential voltages of the conventional level so that the load capacitors on the complementary bit lines need not be balanced stringently.

The above objects of the present invention are attained by providing a dynamic semiconductor memory comprising complementary bit lines for input and output of infomation, storage capacitor means for storing information, and selecting means for specifying storage capacitor means, each of said storage capacitor means having one end connected to one end of said complementary bit lines and the other end to the other end of said complementary bit lines through one of said selecting means to form a memory cell structure. With such a dynamic semiconductor memory, it is possible to obtain much greater differential signal voltages than by the prior art methods even if use is made of memory cells having the same storage capacities. In order to obtain the same differential signal voltage, the present invention allows the storage capacitance of the memory cell, and hence the memory cell areas, to be much smaller than by the conventional method, thus contributing significantly to the production of large-scale dynamic memory elements.

Other objects and characteristics of the present invention will become apparent from an analysis of the following description of specific embodiments of the invention which are provided by way of examples and not of limitation, wherein:

FIG. 1 is a circuit diagram of a dynamic semiconductor memory according to an embodiment of the present invention;

FIGS. 2 through 5 are timing diagrams for the circuit of FIG. 1;

FIG. 6 shows the differential signal voltages inputted to the sense amplifier of the circuit of FIG. 1 according to the present invention and of a conventional circuit;

FIG. 7 is a circuit diagram according to another embodiment of the present invention;

FIGS. 8 and 9 are timing diagrams for the circuit of FIG. 7;

FIG. 10 shows the differential signal voltages inputted to the sense amplifier of the circuit of FIG. 7 according to the present invention and of a conventional circuit;

FIG. 11 is a circuit diagram according to still another embodiment of the present invention;

FIGS. 14 and 15 are timing diagrams for the conventional circuit of FIG. 13.

Figure 12:
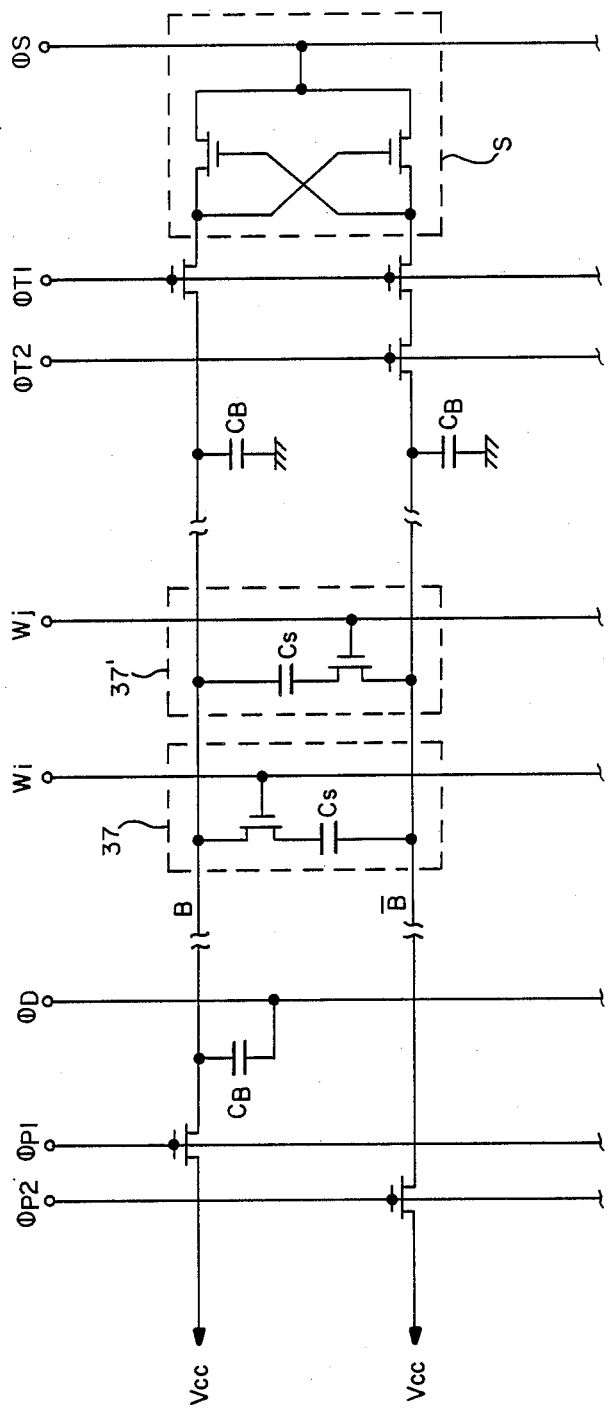
FIG. 12 is a circuit diagram according to a still further embodiment of the present invention.

There is shown in FIG. 1 an example of dynamic semiconductor memory according to the present invention which is composed of N-channel MOS circuits. A sense amplifier S is connected to complementary bit lines 1 and 2. Numerals 11 and 11' represent memory cells of the present invention. $W_i$ and $W_j$ are word lines on which signals with amplitudes more than twice that of the source voltage $V_{CC}$ are applied. Numerals 12 and 12' are storage capacitors; one end of each is connected to the bit line 1 or 2 while the other end is connected to the other bit line 2 or 1 through the source-drain route of a transfer gate 13 or 13' for selecting a memory cell. The gate of the aforementioned transfer gate 13 is connected to the word line $W_i$ and that of the transfer gate 13' is connected to the word line $W_j$. Numerals 10 and 10' are parasitic bit line capacitors. Capacitance of the storage capacitors 12 and 12' will be denoted by $C_S$ and that of the bit line capacitors will be denoted by $C_B$.

FIGS. 2 through 5 are timing diagrams presented for the purpose of explaining the activities in the circuit of FIG. 1. In FIG. 1, it will be assumed that the bit lines 1 and 2 are precharged to the level of source voltage $V_{CC}$ during a precharge period (during which the precharge signal $\phi_P$ is at a high voltage). In what follows, the bit lines 1 and 2 will also be referred to as B and $\overline{B}$, respectively, and only the situation where the memory cell 11 is selected will be considered for convenience. The situation where B is at a high potential and $\overline{B}$ is at a low potential will be made to correspond to logic "1" and the situation where B is at a low potential and $\overline{B}$ is at a high potential to logic "0".

(I) Writing logic "1" (see FIG. 2)

When the precharge signal $\phi_P$ drops at the beginning of an active period, a selection signal greater than the source voltage $V_{CC}$ is applied to the word line $W_i$ to select the memory cell 11. The source voltage $V_{CC}$ is applied also to the bit line B and a ground potential GND is applied to the bit line $\overline{B}$ so that the node 14 of the storage capacitor 12 reaches the source voltage $V_{CC}$ and the side of the storage capacitor 12 towards the bit line $\overline{B}$ drops to the ground potential level GND, the capacitor 12 thus becoming charged.

At the end of an active period, when the word line $W_i$ drops to a negative potential ($-V_{CC}$), the transfer gate 13 becomes cut off and the bit lines B and $\overline{B}$ are precharged to the source voltage $V_{CC}$, the node 14 rises nearly to $2V_{CC}$ and the capacitor 12 remains charged.

(II) Writing logic "0" (see FIG. 3)

When the memory cell 11 is selected similarly as in the case of writing logic "1" and the ground potential GND and the source voltage $V_{CC}$ are applied respectively to the bit lines B and $\overline{B}$, the node 14 of the storage capacitor 12 drops to the ground potential GND and the bit line $\overline{B}$ reaches the source voltage $V_{CC}$, the capacitor 12 thus becoming charged. At the end of an active period, the word line $W_i$ drops to a negative potential ($-V_{CC}$), the transfer gate 13 becomes cut off and the bit lines B and $\overline{B}$ are precharged to the source voltage $V_{CC}$ but the node 14 remains at the ground potential GND.

(III) Reading logic "1" (see FIG. 4)

When the precharge signal $\phi_P$ drops at the beginning of an active period, the bit lines B and $\overline{B}$ which have been precharged to the source voltage $V_{CC}$ are disconnected from the source and enter a floating condition. At time $t_1$, a selection signal greater than the source voltage $V_{CC}$ is applied to the word line $W_i$ to select the memory cell 11. In this situation, since the node 14 of the memory cell 11 has already been charged to $2V_{CC}$, the potential $V_{B1}$ of the bit line B rises beyond the source voltage $V_{CC}$ while the potential $V_{B2}$ of the bit line $\overline{B}$ drops below the level of the source voltage $V_{CC}$. $V_{B1}$ and $V_{B2}$ are now expressed as follows:

$$V_{B1} = V_{CC}(C_B + 3C_S)/(C_B + 2C_S)$$

and $$V_{B2} = V_{CC}(C_B + C_S)/(C_B + 2C_S).$$

Accordingly, the differential signal voltage $\Delta V$ inputted to the sense amplifier S is:

$$\Delta V = V_{B1} - V_{B2} = 2C_S V_{CC}/(C_B + 2C_S) \qquad \text{Eq. 2}$$

Subsequently, at time $t_2$ the sense amplifier S is activated to amplify the aforementioned differential signal to a desired level and the rewriting into the storage capacitor 12 is effected.

(IV) Reading logic "0" (see FIG. 5)

The memory cell 11 is selected similarly as in the case of reading logic "1". In this situation, however, since the node 14 of the memory cell 11 has been maintained at the ground potential level GND, the potential $V_{B1}$ of the bit line B drops to a level below the source voltage $V_{CC}$ while the potential $V_{B2}$ of the bit line $\overline{B}$ rises beyond the level of the source voltage $V_{CC}$. $V_{B1}$ and $V_{B2}$ are now expressed as follows:

$$V_{B1} = V_{CC}(C_B + C_S)/(C_B + 2C_S)$$

and $$V_{B2} = V_{CC}(C_B + 3C_S)/(C_B + 2C_S).$$

Accordingly, the differential signal voltage $\Delta V$ inputted to the sense amplifier S is:

$$\Delta V = V_{B2} - V_{B1} = 2C_S V_{CC}/(C_B + 2C_S) \qquad \text{Eq. 3}$$

This is identical to the value obtained in the case of reading logic "1". Subsequently, the sense amplifier S is activated and amplification is effected as described in (III). It can be seen clearly by comparing Eqs. 2 and 3 with Eq. 1 that the differential signal voltage by the present invention is much greater.

The characteristics of differential signal voltage by the conventional circuit and by the circuit of the present invention are compared in FIG. 6 wherein Curve 20 represents the present invention by Eq. 3 and Curve 21 represents the prior art circuit by Eq. 1. FIG. 6 shows clearly that differential signal voltages 3-4 times as large can be obtained by a circuit of the present invention when the ratio $C_B/C_S$ is within a practical range (5–15). This means that dynamic memory elements with large action margin can be realized by the design of the present invention.

Although the embodiment of the present invention described above has a significantly favorable characteristic that nearly four times as large differential signal voltages can be obtained as by a conventional circuit, the peripherial circuitry may become somewhat more complicated because the word line $W_i$ must be provided with a voltage with amplitude over twice as large as the source voltage $V_{CC}$ and a negative voltage of absolute value greater than the source voltage (or a voltage below $-V_{CC}$) must be applied to LSI substrate.

There is shown in FIG. 7 a variation of the embodiment described above, to which conventional technologies regarding peripheral circuits can be applied although the resultant differential signal voltage is only about twice the conventionally obtainable value.

The embodiment in FIG. 7 includes a sense amplifier S connected to complementary bit lines 1 and 2 which will again be referred to respectively as B and $\overline{B}$ for convenience and logic "1" will correspond to the situation where B is at a high potential and $\overline{B}$ is at a low potential while logic "0" will correspond to the situation where B is at a low potential and $\overline{B}$ is at a high potential. Numerals 23 and 23' are memory cells. In what follows, only the situation where the memory cell 23 is selected will be discussed for convenience. Numeral 29 is a dummy boost capacitor with one end connected to the bit line B and a dummy drive signal $\phi_D$ adapted to be applied to the other end so that the dummy drive signal $\phi_D$ will boost the bit line 1 before the reading is effected from the memory cell. Capacitance $C_D$ of the dummy boost capacitor 29 is set nearly equal to $C_S$ of the memory cell 23. $W_i$ and $W_j$ are word lines as before, $\phi_{P1}$ and $\phi_{P2}$ are bit line precharge signals, $\phi_{T1}$ and $\phi_{T2}$ are signals for temporarily cutting the bit lines off from the sense amplifier S electrically, and $\phi_S$ is a sense amplifier drive signal.

One end of the bit line 1 is connected to an input terminal 30 of the sense amplifier S through the source-drain route of a transfer gate transistor 27 to the gate of which the signal $\phi_{T1}$ is applied, while the other end in connected to a source voltage $V_{CC}$ through the source-drain route of a transistor 24 to the gate of which the signal $\phi_{P1}$ is applied. As for the bit line 2, one end is connected to the other input terminal 30' of the sense amplifier S through a serial combination of the source-drain routes of another transfer gate transistor 26 to the gate of which the signal $\phi_{T2}$ is applied and still another transfer gate transistor 27' to the gate of which the signal $\phi_{T1}$ is applied, while the other end is connected to the source voltage $V_{CC}$ through the source-drain of a transistor 25 to the gate of which the signal $\phi_{P2}$ is applied. During a precharge period, both precharge signals $\phi_{P1}$ and $\phi_{P2}$ are above the source voltage $V_{CC}$ and the bit lines 1 and 2 are both precharged to the source voltage $V_{CC}$ through the transistors 24 and 25, respectively.

(I) Writing logic "1"

During an active period, both precharge signals $\phi_{P1}$ and $\phi_{P2}$ are down to the ground potential level GND. The bit lines 1 and 2 are both maintained at the source voltage $V_{CC}$ by means of a write circuit (not shown) and the word line $W_i$ is raised to a level beyond the source voltage $V_{CC}$ so that the source voltage $V_{CC}$ is written in the node 31 of the memory cell 23.

(II) Writing logic "0"

During an active period, the bit lines 1 and 2 are maintained at the ground potential GND and the source voltage $V_{CC}$, respectively, by means of the write circuit (not shown) and the word line $W_i$ is raised to a level beyond the source voltage $V_{CC}$ so that the ground potential GND is written in the node 31 of the memory cell 23.

(III) Reading logic "1" (see FIG. 8)

When the precharge signals $\phi_{P1}$ and $\phi_{P2}$ drop to the ground potential GND at the beginning of an active period, the transistors 24 and 25 disconnect the bit lines 1 and 2 from the source. After a floating condition is established, the dummy drive signal $\phi_D$ is raised to the level of the source voltage $V_{CC}$ and the potential on the side of the bit line 1 is raised slightly above the source voltage $V_{CC}$ due to the combination of the dummy boost capacitor 29.

Next, a selection signal higher than the source voltage $V_{CC}$ is applied to the word line $W_i$ to make the transfer gate 32 conductive and the bit lines 1 and 2 become capacitively connected by the storage capacitor 33 but there is hardly any change in the potential of the bit lines 1 and 2 because the source voltage $V_{CC}$ is already maintained at the node 31 of the memory cell 23. If we assume $C_D = C_S$ in order to simplify the calculation, the potentials $V_{B1}$ and $V_{B2}$ respectively of the bit lines 1 and 2 become $V_{B1} \simeq V_{CC}(C_B+4C_S)/(C_B+3C_S)$ and $V_{B2} \simeq V_{CC}$. Thus, the differential input signal voltage $\Delta V$ of the sense amplifier S becomes:

$$\Delta V = V_{B1} - V_{B2} \simeq C_S/(C_B+3C_S) \qquad \text{Eq. 4}$$

The signal $\phi_{T1}$ drops to the ground potential GND when the aforementioned differential input signal is inputted to the input terminals 30 and 30' of the sense amplifier S. After the transistors 27 and 27' disconnect the sense amplifier S from the bit lines 1 and 2, the sense drive signal $\phi_S$ drops and the potential at the nodes 30 and 30' is raised to a desired level.

At this point, the precharge signal $\phi_{P2}$ is raised again and the bit line 2 is firmly maintained at the source voltage $V_{CC}$. When the amplification by the sense amplifier S is completed, the signal $\phi_{T1}$ is raised again to connect the bit line 1 and the sense amplifier S through the transistor 27. In this situation, there is no need to rewrite in the node 31 of the memory cell 23 because it is maintained at a high voltage.

(IV) Reading logic "0" (see FIG. 9)

Operations before a selection signal is inputted to the word line $W_i$ are the same as in the case of reading logic "1". In the case of reading logic "0", however, potential of the bit line 1 drops and that of the bit line 2 goes up when the transfer gate 32 becomes conductive by the selection signal because the ground potential GND is already maintained at the node 31 of the memory cell 23. At this point, potentials $V_{B1}$ and $V_{B2}$ of the bit lines 1 and 2, respectively, are given by $V_{B1} \simeq V_{CC}$ and $V_{B2} \simeq V_{CC}(C_B+4C_S)/(C_B+3C_S)$. Accordingly, the differential input signal voltage $\Delta V$ of the sense amplifier S becomes:

$$\Delta V = V_{B2} - V_{B1} \simeq C_S/(C_B+3C_S). \qquad \text{Eq. 5}$$

In this situaton, too, potential at the nodes 30 and 30' is amplified by the sense drive signal $\phi_S$ after the signal $\phi_{T1}$ has dropped.

At this point, the precharge signal $\phi_{P2}$ is raised again and the bit line 2 is firmly maintained at the source voltage $V_{CC}$. If the signal $\phi_{T1}$ is raised again at the completion of the amplification by the sense amplifier S, potential on the side of the bit line 1 drops to the ground potential level GND through the transfer gate 27, the node 31 of the memory cell 23 reaches the ground potential level GND again and rewriting is effected into the memory cell.

Figure 13:
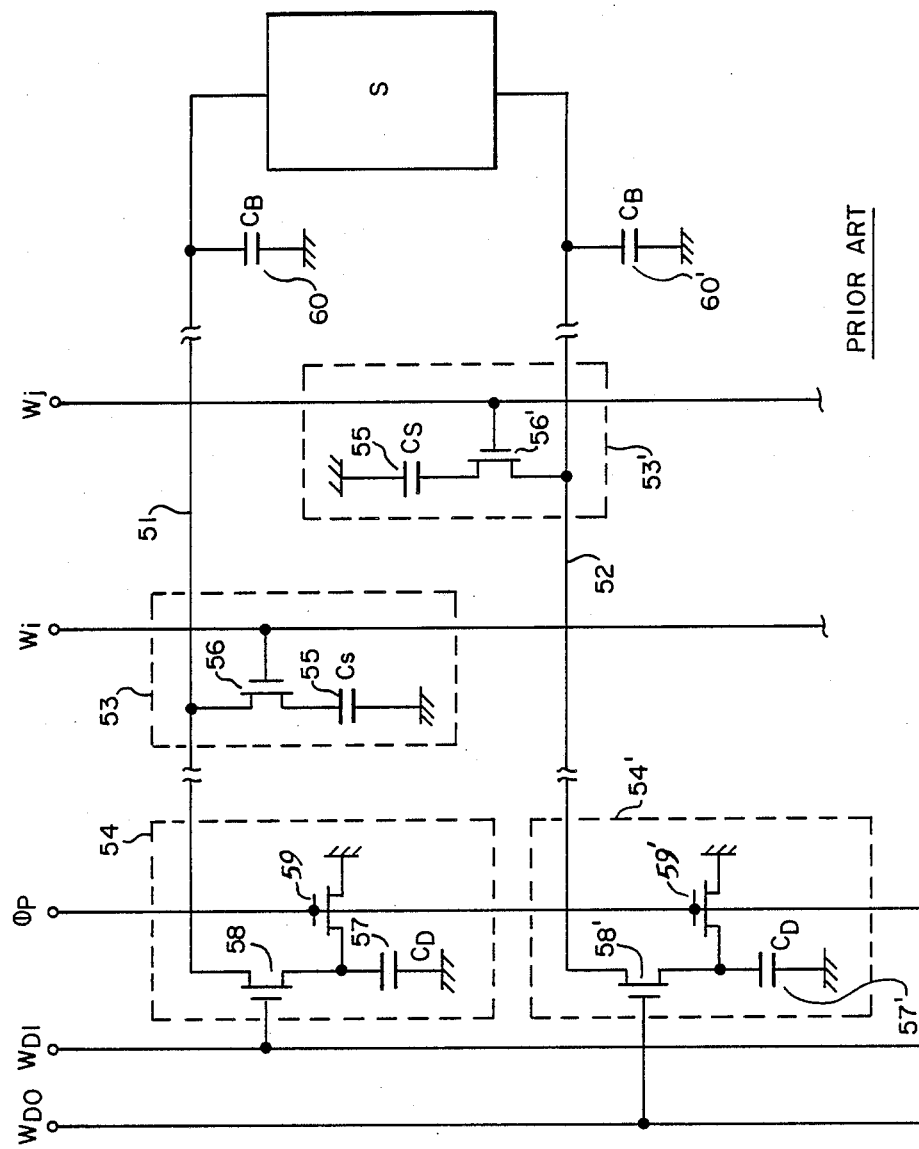
FIG. 13 is an example of circuit diagram showing the structure of a conventional dynamic memory element.

In FIG. 10, the aforementioned variation according to the present invention is compared with the conventional circuit of FIG. 13. In FIG. 10, Curve 34 is the differential signal voltage (Eqs. 4 and 5) according to this embodiment and the Curve 35 shows the characteristic according to Eq. 1. FIG. 10 clearly shows that greater differential signal voltages can be obtained by the present invention and that the obtainable voltage becomes 1.5-2 times the voltage by the conventional circuit in particular when the ratio $C_B/C_S$ is large. This means that elements with a large margin of operation can be easily created and that the present invention contributes significantly to the production of large-scale dynamic memory elements.

FIG. 11 shows another variation of the present invention and FIG. 12 is a circuit diagram of a still further variation. The embodiment shown in FIG. 11 is distinguishable from that of FIG. 7 in that the memory cells 36 and 36' are connected to the bit lines 1 and 2 with reversed polarity. According to the embodiment of FIG. 12, the polarity relationship is mixed between the memory cells 37 ad 37' and the bit lines 1 and 2. Timing diagrams for the circuits of FIGS. 11 and 12 are not shown because they are very similar to those for the circuit of FIG. 7.

Although N-channel MOS circuits were used above to explain the present invention, the present invention is not intended to limit the production process for producing the disclosed elements but can be applied to P-channel MOS processes, CMOS processes, SOI processes, bipolar processes, etc. Moreover, although the capacitances of the complementary bit lines were assumed to be equal above in order to simplify the explanation, neither is it itended to restrict the present invention. It goes without saying that different wiring means may be used for the complementary bit lines. The scope of the present invention is limited only by the following claims.

What is claimed is:

1. A method of operating a dynamic semiconductor memory, said memory comprising
    a first bit line and second bit line for input and output of information, said first and second bit lines being complementary to each other, and
    a plurality of memory cells, each including a selecting means for specifying said memory cell, and a storage capacitor means for storing information, said storage capacitor means having a first terminal connected to said first bit line through said selecting means and a second terminal connected to said second bit line, said first terminal and said selecting means defining a node therebetween,
    said method comprising the steps of
    precharging both said first and second bit lines to the level of a source voltage during a precharge period,
    selecting one of said memory cells by causing said selecting means to electrically connect said first terminal to said first bit line,
    writing a first logic in said selected memory cell by applying said source voltage to said first bit line and ground potential to said second bit line after said precharge period and electrically disconnecting said storage capacitor means from said first bit line, thereby causing the potential of said node to rise to nearly twice said source voltage, or writing a second logic in said selected memory cell by applying ground potential to said first bit line and said source voltage to said second bit line after said precharge period and electrically disconnecting said storage capacitor means from said first bit line, thereby causing the potential of said node to remain at ground potential.

2. The method of claim 1 further comprising the steps of reading a selected memory cell by causing the potential of said first bit line to rise above said source voltage and the potential of said second bit line to drop below said source voltage, or by causing the potential of said first bit line to drop below said source voltage and the potential of said second bit line to rise above said source voltage.

3. The method of claim 1 wherein said selecting means comprise a transfer gate connected to a word line and said selecting step comprises applying a selection signal more than twice said source voltage through said word line to said transfer gate.

* * * * *